(12) United States Patent
Naffziger

(10) Patent No.: US 6,606,720 B1
(45) Date of Patent: Aug. 12, 2003

(54) SCAN STRUCTURE FOR CMOS STORAGE ELEMENTS

(75) Inventor: Samuel D. Naffziger, Ft. Collins, CO (US)

(73) Assignee: Hewlett-Packard Development Company, Houston, TX (US)

( * ) Notice: Subject to any disclaimer, the term of this patent is extended or adjusted under 35 U.S.C. 154(b) by 0 days.

(21) Appl. No.: 09/510,006

(22) Filed: Feb. 22, 2000

(51) Int. Cl.[7] .............................................. G01R 31/28
(52) U.S. Cl. ...................................................... 714/726
(58) Field of Search ............................. 714/726; 326/16

(56) References Cited

U.S. PATENT DOCUMENTS

| | | | |
|---|---|---|---|
| 4,495,629 A | 1/1985 | Zasio et al. | 377/70 |
| 5,175,447 A | 12/1992 | Kawasaki et al. | 307/480 |
| 5,281,864 A | 1/1994 | Hahn et al. | 307/272.2 |
| 5,444,404 A | 8/1995 | Ebzery | 327/185 |
| 5,668,490 A | 9/1997 | Mitra et al. | 327/203 |
| 5,689,517 A * | 11/1997 | Ruparel | 714/731 |
| 5,719,878 A * | 2/1998 | Yu et al. | 714/726 |
| 5,859,999 A | 1/1999 | Morris et al. | 712/23 |
| 5,860,017 A | 1/1999 | Sharangpani et al. | 712/224 |

OTHER PUBLICATIONS

"Patents shed light on Merced" by Alexander Wolfe, Electronic Engineering Times, Feb. 15, 1999, pp. 43 and 44.

* cited by examiner

*Primary Examiner*—Albert Decady
*Assistant Examiner*—Shelly A Chase (57) ABSTRACT

Scan chain links which step data through a scan chain using only a single control signal, and which require a reduced number of transistors to scan data into and out of a latch. One scan chain link, which allows the output of a scanned latch to "wiggle", uses eight transistors and only a single control signal. Another scan chain link, which prevents the output of a scanned latch from "wiggling", and which allows data to be maintained in a latch during a scan operation if it is so desired, uses twenty-five transistors and two control signals: one control signal for stepping data through a scan chain, and an additional control signal for preventing the output of a scanned latch from wiggling.

22 Claims, 7 Drawing Sheets

SCAN STRUCTURE FOR CMOS STORAGE ELEMENTS

FIELD OF THE INVENTION

The invention pertains to the scanning of data from a number of complimentary metal-oxide semiconductor (CMOS) storage elements.

BACKGROUND OF THE INVENTION

As the functionality of integrated circuits increases, and the size of integrated circuits decreases, it becomes evermore important to increase the controllability and observability of integrated circuits while decreasing the overhead required for same. A simple way to control and observe the state of storage elements in an integrated circuit is to implement a serial scan chain structure, wherein the data stored in each of a number of storage elements is downloaded into the scan chain, and then stepped from link to link of the scan chain in a serial fashion. A serial scan chain typically requires fewer transistors, less chip area, fewer external pins, etc. than parallel ports and other means for accessing a chip's state. However, even though serial scan chains require less overhead than parallel and other forms of scanning, even serial scan chains have required the addition of two to five control signals per integrated circuit, and from 16 to 32 transistors per storage element accessed on an integrated circuit.

Figure 1:
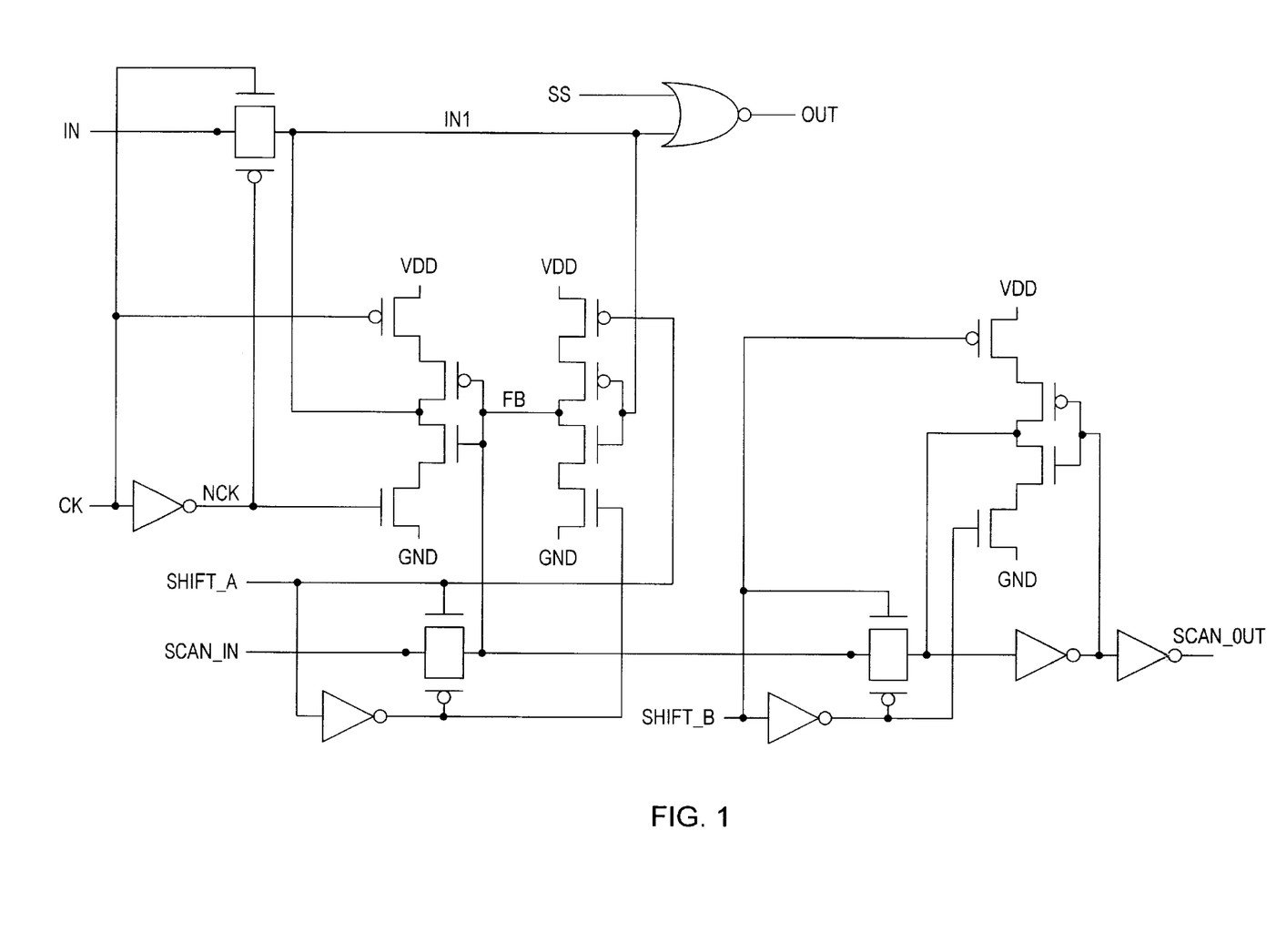
FIG. 1 illustrates a scan chain link which uses two shift signals and sixteen transistors to step data through to a next scan chain link.

The scan chain link illustrated in FIG. 1 requires the use of sixteen transistors for each latch serviced by a scan chain. A first transfer gate of the link is opened and closed by a shift signal SHIFT_A, and a second transfer gate of the link is opened and closed by a shift signal SHIFT_B. When closed, the first transfer gate allows data carried on the scan chain to be input to a latch via the latch's feedback node. The second transfer gate, when closed, allows data stored in the latch to be output to a slave latch. When the first transfer gate of a downstream link is closed, data stored in the slave latch is transferred to a latch serviced by the downstream link. Given that the latch serviced by the FIG. 1 scan chain link serves as a master latch in the link, and data is input and output to this master via the latch's feedback node, it is necessary that shift signals SHIFT_A and SHIFT_B be asserted in an alternate and non-overlapping fashion. In this manner, shift signal SHIFT_A is asserted while shift signal SHIFT_B is at rest, thus stepping scan data into the master latch. Shift signal SHIFT_A is then de-asserted, and after a brief delay, shift signal SHIFT_B is asserted, thus stepping scan data from the master latch to the slave latch. Thereafter, shift signal SHIFT_B is de-asserted, and shift signal SHIFT_A is asserted to step scan data from the slave latch into the master latch of a downstream link. Each of the inverters following a latch node which can receive data (whether it be the storage node of the master latch, the feedback node of the master latch, or the storage node of the slave latch) is implemented as an enabled inverter so that a newly latched data value may overdrive the inverter more easily. The data stored by the FIG. 1 master latch is NORed with a signal SS to produce an output. In this manner, assertion of the SS signal allows the output of the latch to be driven to a constant value despite the stepping of various scan data values through the latch (i.e., the output of the latch can be driven to a "non-wiggle" state).

Figure 2:
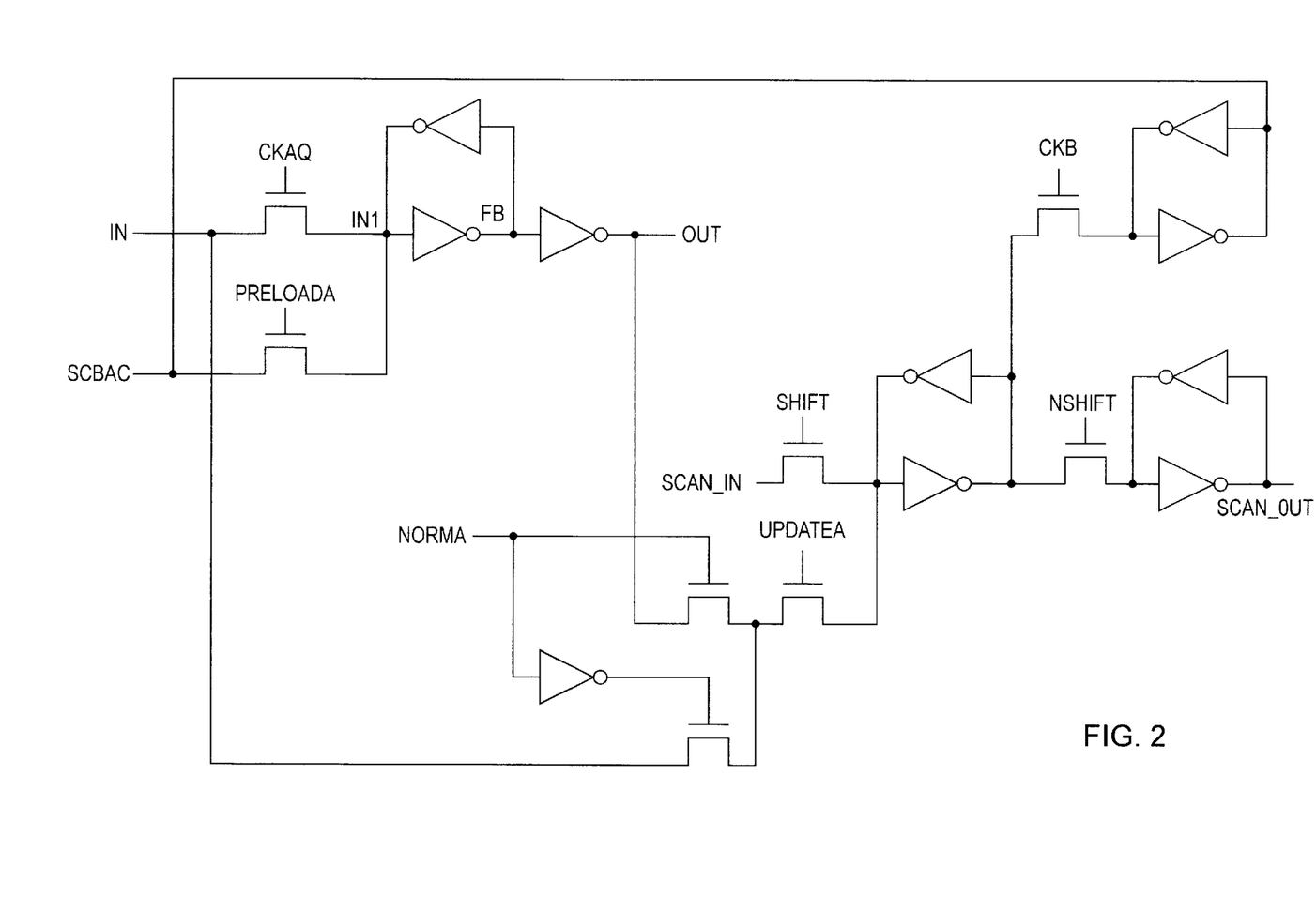
FIG. 2 illustrates a scan chain link which uses a single shift signal and twenty-one transistors to step data through to a next scan chain link; however, the scan chain link requires four additional control signals to transfer data between the scan chain link and a latch which it services.

The scan chain link illustrated in FIG. 2 requires the use of twenty-one transistors for each latch serviced by a scan chain. The link comprises seven transfer gates. A first pair of transfer gates, or those driven by the signals SHIFT and UPDATEA, determine whether data stepped into a master latch of the scan chain link is derived from an upstream scan chain link or the latch being serviced by the FIG. 2 scan chain link. A second pair of transfer gates, or those driven by the signals NORMA and the inverse of NORMA, determine whether data loaded into the link from the latch which it services is derived from the latch's input or output. A fifth transfer gate, or the one driven by the signal NSHIFT, is opened and closed in an out of phase relationship with respect to the transfer gate driven by the signal SHIFT. In this manner, the transfer gate driven by the signal SHIFT steps data from link to link of a scan chain, and the transfer gate driven by the signal NSHIFT steps data from master latch to slave latch within a scan chain link. A last pair of transfer gates, or those driven by the signals CKB and PRELOADA, are used to step data from a scan chain into an intermediate latch, and then finally into the latch which is being serviced by a scan chain link.

An advantage of the FIG. 1 scan chain link is that the latch being serviced serves as the master latch for the link, thus enabling a reduced transistor count for each scan chain link (i.e., sixteen transistors).

Although the above scan chain links offer various advantages, the ever increasing number of storage elements appearing in a single VLSI circuit, as well as the desire to provide better observability and testability of these storage elements, leads to a push for a reduction in the amount of overhead required to implement a scan chain structure.

SUMMARY OF THE INVENTION

In the achievement of the foregoing objects, the inventor has devised methods and apparatus for scanning data into and out of a latch. The methods and apparatus reduce the transistor count for a "wiggle" scan chain link (i.e., one in which the output of a scanned latch is allowed to change while a scan is being performed) to eight transistors, and allow a single periodic shift signal to fully control operation of the scan chain link. The methods and apparatus also reduce the transistor count of a "non-wiggle" scan chain link to twenty-five, with a need for only two control signals.

A first embodiment of the invention is adapted to be implemented as part of a serial scan chain which services a plurality of latches. The first embodiment of the invention comprises a scan chain link having first and second transfer gates. The first transfer gate comprises 1) an input for receiving a scan output of a latch N−1 which is being serviced by the scan chain, 2) an output coupled to a latch N which is being serviced by the scan chain, and 3) a number of control inputs. The second transfer gate comprises 1) an input coupled to the latch N2) an output which provides a scan output for the latch N, and 3) a number of control inputs. The control inputs of the two transfer gates are preferably fed by a single periodic shift signal, and are designed such that the periodic shift signal alternately causes one or the other of the transfer gates to conduct.

A second embodiment of the invention is also adapted to be implemented as part of a serial scan chain which services a plurality of latches. The second embodiment of the invention comprises a scan chain link having first and second transfer gates, a latch means, and a means for loading data stored in the latch means into a latch N which is being serviced by the scan chain link. The latch means is designed to periodically receive and store a copy of data which is held in the latch N. The latch means receives a copy of data held in the latch N in response to the assertion of a signal which loads data into the latch N (i.e., preferably a clock signal). The first transfer gate comprises an input for receiving a scan output of a latch N−1 which is being serviced by the scan chain, an output which is coupled to a first node of the latch means, and a number of control inputs. The second transfer gate comprises an input which is coupled to a second node of the latch means, an output which provides a scan output for the latch, and a number of control inputs. Once again, the control inputs of the two transfer gates are preferably fed by a single periodic shift signal, and are designed such that the periodic shift signal alternately causes one or the other of the transfer gates to conduct.

The above and other embodiments of the invention will be further explained in, or will become apparent from, the accompanying description, drawings and claims.

BRIEF DESCRIPTION OF THE DRAWINGS

Illustrative and presently preferred embodiments of the invention are illustrated in the drawings, in which.

DESCRIPTION OF THE PREFERRED EMBODIMENTS

An assumption made in the following description and claims is that every storage element comprises a storage node and a feedback node. It is also assumed that every storage element comprises an input and an output. It is further assumed that the input of a storage element may be coupled (possibly directly, and possibly via an element such as a transfer gate) to either the storage node or the feedback node of the storage element, but not both. Furthermore, the output of a storage element may be coupled (possibly directly, and possibly via an element such as an inverting buffer) to either the storage node or the feedback node of the storage element, but not both. For the intents and purposes of the following description and claims, a storage element's storage node and feedback node are interchangeable, so long as the naming convention used does not result in a storage element's output node being directly coupled to its input node.

One final assumption which is made in the following description is that a "closed" transfer gates conducts, and an "open" transfer gate does not conduct.

It is further noted that the preferred embodiments of scan chain links discussed herein are disclosed as servicing latches. However, the disclosed scan chain links may be easily adapted for servicing other types of storage elements, as will be understood by those skilled in the art. Latches are merely disclosed as an exemplary form of storage element which the disclosed scan chain links can service. Also, it is disclosed that the preferred embodiments of scan chain links discussed herein comprise "transfer gates". Preferred embodiments of such transfer gates are then disclosed. It is considered to be within the scope of the invention that any mentioned transfer gate might be replaced with any tri-statable element having a high impedance state.

Figure 3:
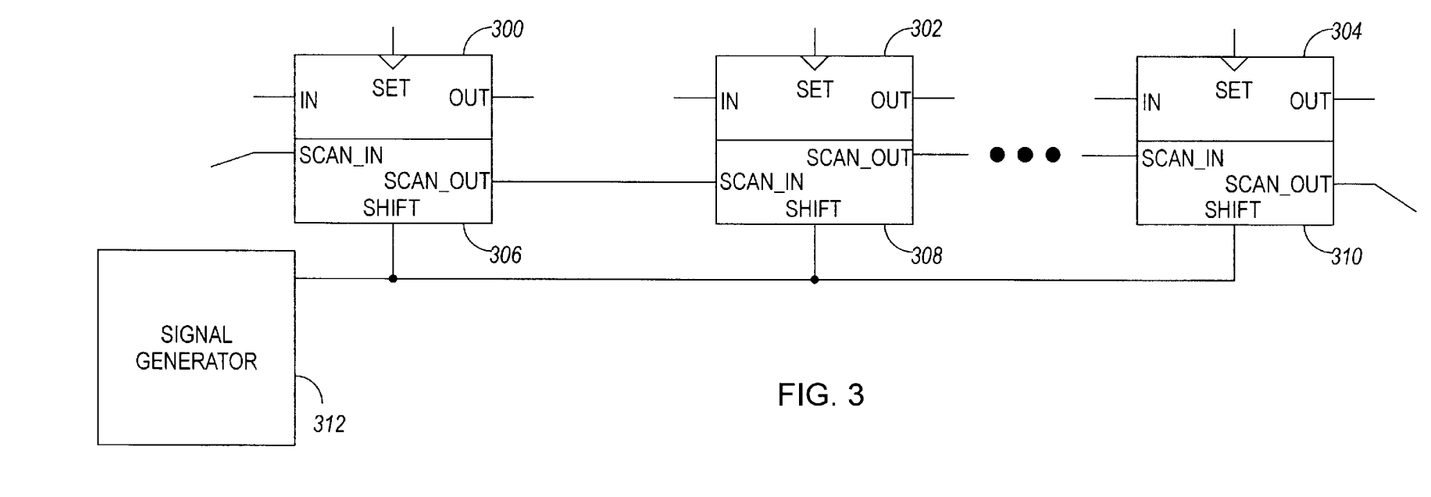
FIG. 3 illustrates a scan chain which is operated by a single shift signal.

A scan chain 306, 308, 310 embodying the principles of the invention is illustrated in FIG. 3. The scan chain 306–310 services a plurality of latches 300, 302, 304, each of which comprises a latch input, a latch output, and a set input. It is conceivable that the set inputs might receive the same or different signals for stepping data into the number of latches. Preferably, these signals are clock signals. Associated with each of the latches 300–304 is a scan chain link 306–310 which services the latch for the purpose of scanning data into and out of the latch. Each scan chain link 306–310 comprises a scan input, a scan output, and a shift input. The shift inputs are tied to a single shift line (i.e., control line) which receives a periodic signal produced by a signal generator 312. The periodic signal preferably has two phases (e.g., the periodic signal would ideally be a square wave). Alternately, the shift inputs could be tied to differing shift signals. However, an important feature of the invention is the ability to step data through all of the links in a scan chain 306–310 with as few as one shift signal.

Figure 4:
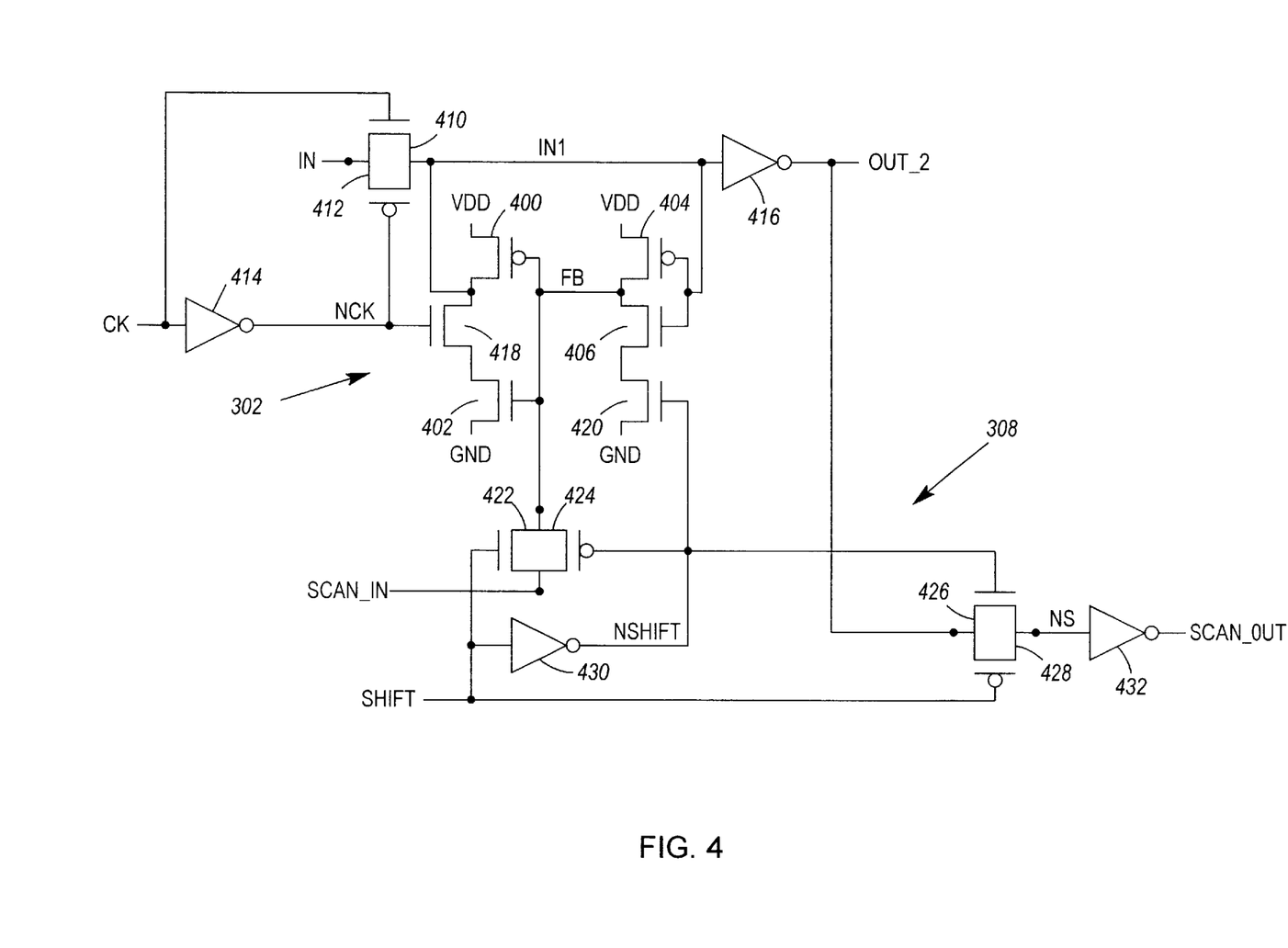
FIG. 4 illustrates a first preferred scan chain link which uses a single shift signal and only eight transistors to step data through to a next scan chain link.

A preferred embodiment of a latch 302 and its associated scan chain link 308 are illustrated in more detail in FIG. 4. The latch 302 may be configured in a variety of ways. However, a preferred latch embodiment comprises first and second inverting buffers 400/402, 404/406 coupled in a loop fashion, an input transfer gate 410/412, an output inverting buffer 416, and a clock input. Each of the inverting buffers 400/402, 404/406, 416 comprises a p-type field effect transistor 404 (PFET) which is coupled in series with an n-type field effect transistor 406 (NFET). The two transistors 404, 406 are coupled between power rails VDD and GND, and the series connection point for the two transistors 404, 406 is a source or drain of each. The PFET 404 of each inverter 404/406 creates a pullup leg of the inverting buffer 404/406, and the NFET 406 of each inverter 404/406 creates a pulldown leg.

In coupling the first and second inverters 400/402, 404/406 in a loop fashion, two nodes are created: IN1, which is hereinafter referred to as the storage node, and FB, which is hereinafter referred to as the feedback node.

The latch input, IN, is switchably coupled to storage node IN1 via a transfer gate 410/412 comprising an NFET 410 and a PFET 412 which are connected in parallel via the sources and drains of each. Opening and closing of the input transfer gate 410/412 is controlled by a clock signal (CK) and its logical inverse (NCK). The clock signal is coupled to the gate of the NFET 410, and the inverse of the clock signal is coupled to the gate of the PFET 412. The inverse of the clock signal is produced by yet another inverting buffer 414. When the clock signal is asserted, the input transfer gate 410/412 is closed, and data which is present at the latch's input is transferred to node IN1. When the clock signal is de-asserted, data appearing on node IN1 is held in storage by the latch 302.

In addition to serving as a control for the input transfer gate 410/412, inverse clock signal NCK is used to drive the gate of an NFET 418 which is coupled in series with the inverting buffer 400/402. In this manner, it is easier to overdrive NFET 402 when a new data value is clocked into node IN1.

The output of the latch, OUT, is produced by an output inverting buffer 416 which has its input tied to node IN1. The latch 302 is therefore an inverting latch.

The scan chain link 308 which is associated with the latch 302 comprises first and second transfer gates 422/424, 426/428, a shift input, and an output inverting buffer 432. Each transfer gate 422/424, 426/428 comprises an NFET 422 and a PFET 424 which are connected in parallel via the sources and drains of each. Opening and closing of the transfer gates 422/424, 426/428 is controlled by a shift signal (SHIFT) and its logical inverse (NSHIFT). For the first transfer gate 422/424, the shift signal is coupled to the gate of the NFET 422, and the inverse of the shift signal is coupled to the gate of the PFET 424. The inverse of the shift signal is produced by an inverting buffer 430. For the second transfer gate 426/428, the shift signal is coupled to the gate of the PFET 428, and the inverse of the shift signal is coupled to the gate of the NFET 426. In this manner, assertion of the shift signal results in a closing of the first transfer gate 422/424 and an opening of the second 426/428, while de-assertion of the shift signal results in a closing of the second transfer gate 426/428 and an opening of the first 422/424. Thus, the two transfer gates 422/424, 426/428 are opened and closed out of phase (i.e., in an alternating manner).

The output of the first transfer gate 422/424 is tied to the feedback node, FB, of the latch 302. Closing of the first transfer gate therefore injects data appearing at a scan link input, SCAN_IN, into the latch 302. When scan data is being supplied to the latch's feedback node, the inverse of the shift signal prevents current from conducting through an NFET 420 which is connected in series with the second inverting buffer 404/406 of the latch 302. In this manner, it is easier to overdrive NFET 406 when scan data is shifted into the latch 302 via its feedback node FB.

Figure 5:
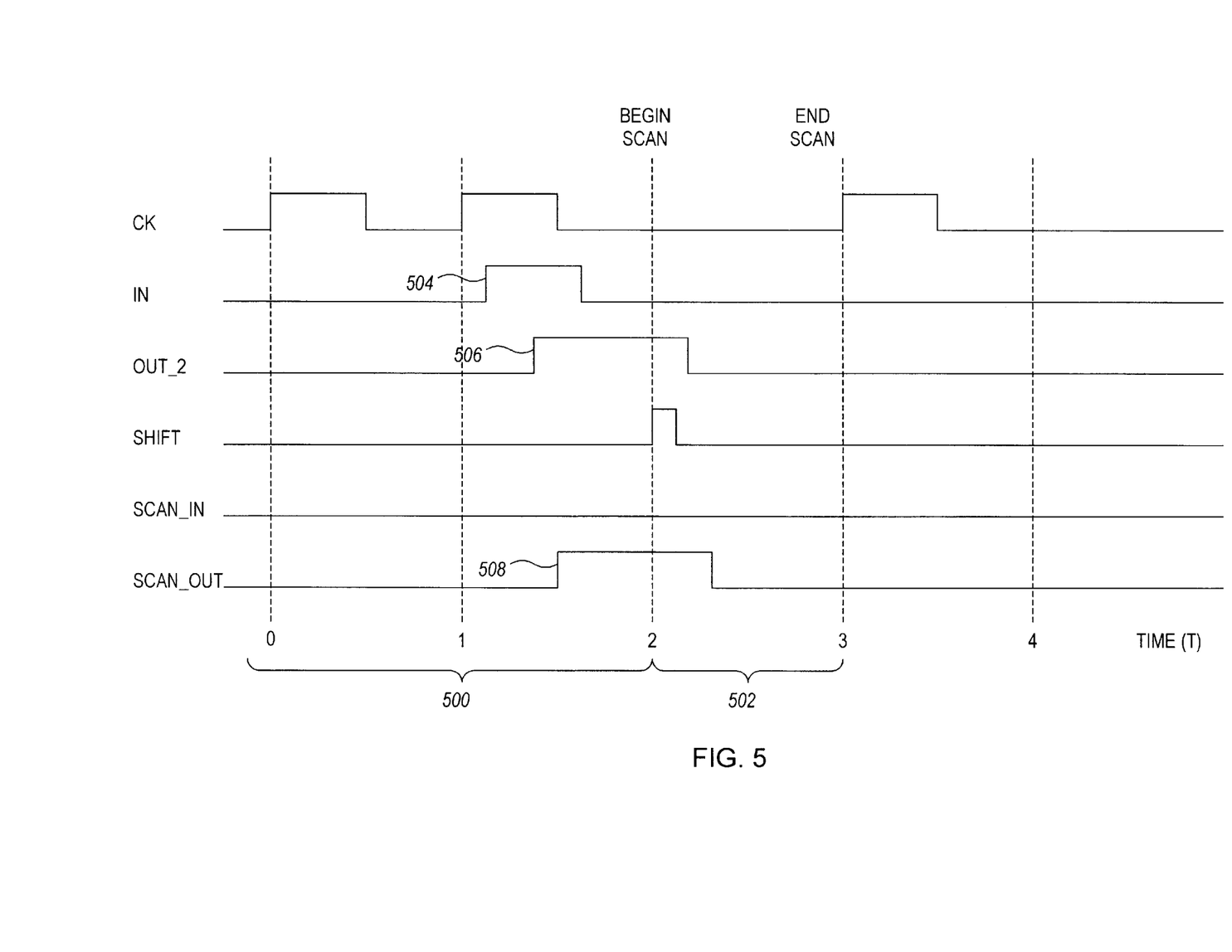
FIG. 5 illustrates timing relationships between various of the signals depicted in FIG. 4.

FIG. 5 illustrates timing relationships between various of the signals depicted in FIG. 4. FIG. 5 is essentially divided into two time frames: one time frame 500 in which the latch 302 is used for its intended purpose, and another time frame 502 in which data is scanned out of and into the latch 302. When the latch 302 is operating for its intended purpose, clock CK takes the form of a square wave. During each high time of the clock, data appearing at latch input IN is clocked into the latch 302, and shortly thereafter appears at output OUT_2. For example, shortly after time T=1, input IN rises high 504. Thereafter, output OUT_2 rises high 506. During normal operation of the latch 302, shift signal SHIFT is maintained at a low level, thus closing the second transfer gate 426/428 associated with the latch 302 and allowing data to propagate to SCAN_OUT 508 shortly after it appears at OUT_2.

When a scan of data out of the latch 302 is begun, the periodic nature of clock CK is discontinued, and shift signal SHIFT takes on the form of a square wave. When SHIFT is asserted, data appearing at SCAN_OUT propagates to a downstream scan chain link 310, and data appearing at SCAN_IN is stepped into latch 302. To eliminate the possibility of a race-through condition, in which data races through the first transfer gate 422/424, into the latch 302, and then through the second transfer gate 426/428 before the second transfer gate can be fully opened, the size of the latch's FETS 402, 416 may be chosen so as to impart the required delay to a signal's propagation from node FB to node OUT_2. However, the placement of the scan chain link's transfer gates 422/424, 426/428 also helps to prevent a race-through condition.

Note that during each cycle of the shift signal, data existing at the SCAN_IN node is stepped into latch 302. In this manner, data may first be read from a plurality of latches 300–304 by stepping a scan chain, and then the same and/or new data may be written into the plurality of latches 300–304 through further stepping of the scan chain.

Although SHIFT is only asserted once in FIG. 5, an actual scan chain operation would most likely result in a plurality of assertions of SHIFT, thereby allowing data to be stepped through a large number of latches. When scanning is complete, the shift signal is deasserted, and clock CK can once again take on a periodic form.

Note that the high time of the shift signal is preferably short so that the period of conductance for the first transfer gate 422/424 is short, and the period of non-conductance for the second transfer gate 426/428 is short. As a result, current leakage at node NS can be mitigated, since data appearing at node NS is only stored capacitively when the second transfer gate 426/428 is open, and is not held by active feedback devices. The lengths of the FETS 426, 428 in the second transfer gate can also be increased to further mitigate leakage at node NS. If leakage at node NS can be adequately mitigated, there is no need for feedback FETS at node NS.

Figure 6:
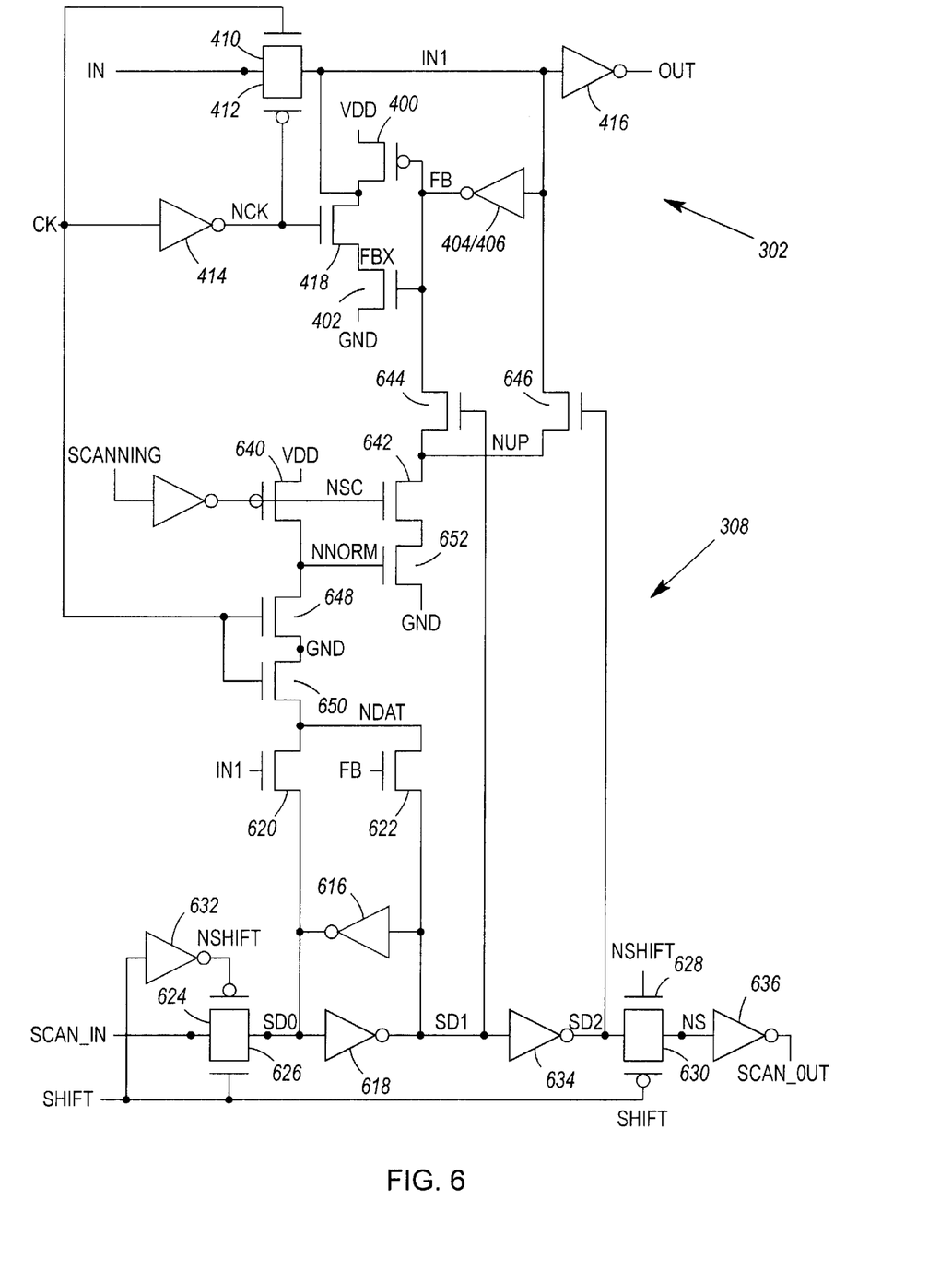
FIG. 6 illustrates a second preferred scan chain link which uses a single shift signal and twenty-three transistors to step data through to a next scan chain link.

Note that the output, OUT_2, of the FIG. 4 latch 302 is dependent on the data values clocked into and out of latch 302 during scanning. The latch's output therefore "wiggles", which can sometimes cause problems with circuits coupled to the latch's output. A "non-wiggle" scan chain link 308, which link can also be operated with as few as one shift signal, is illustrated in FIG. 6. The only extra signal which such a scan chain link 308 requires is a signal (SCANNING) to hold the output (OUT) of a serviced latch steady during scanning. Not only does the SCANNING signal hold a latch's output steady, but it helps to maintain data in a latch 302 so that the data is not corrupted or destroyed during operation of a scan chain 306–310.

A first portion of the FIG. 6 scan chain link 308 comprises a scan latch 616/618 for periodically receiving data which is stored in a latch 302. Data is loaded into the scan latch 616/618 via a link load circuit 620/622/650. The link load circuit comprises two NFETS 620, 622 which are respectively coupled between first (SD0) and second (SD1) nodes of the scan latch and an intermediate node (NDAT) of the link load circuit 620/622/650. The gate of the first of these NFETS 620 is coupled to the storage node (IN1) of the latch 302, and the gate of the second of the NFETS 622 is coupled to the feedback node (FB) of the latch 302. A third NFET 650 of the link load circuit 620/622/650 is coupled between the circuit's intermediate node (NDAT) and ground. The gate of this third NFET 650 is coupled to receive the clock signal, CK, which clocks data into the latch 302. Thus, when clock CK clocks data into latch 302, it also enables the link load circuit 620/622/650 and thereby clocks data into the scan latch 616, 618.

A first transfer gate 624/626 of the FIG. 6 scan chain link 308 is coupled between a scan input (SCAN_IN) received from an upstream scan chain link 306, and the first node of the scan latch 616/618. The second node of the scan chain latch 616/618 is coupled to the input of an inverting buffer 634. The output of the inverting buffer 634 is coupled to the input of a second transfer gate 628/630, the output of which is provided to yet another inverting buffer 636 to thereby produce a scan output (SCAN_OUT).

The first and second transfer gates 624/626, 628/630 are once again operated by a single shift signal (SHIFT), and are opened and closed out of phase. Data is therefore propagated through the FIG. 6 scan chain link 308 without needing to temporarily store data in the latch 302 which it services (i.e., the scan chain link 308 does not rely on the latch 302 which it services to be the master of the scan chain link—this duty is instead filled by the scan latch 616/618).

The FIG. 6 scan chain link 308 requires two additional elements for the purpose of loading data into the latch 302 which it services. The first of these elements is a link drive circuit 644/646. This circuit comprises two NFETS 644, 646, each of which is coupled to a node of the latch 302, and each of which has a gate coupled to a different node (SD1, SD2) of the scan chain link 308. Note that the gate of NFET 646 could alternately be coupled to node SD0.

A source or drain of each of the NFETS 644, 646 in the link drive circuit 644/646 could be coupled to ground so that data was automatically loaded into latch 302 during stepping of the scan chain link 308. However, this would result in the output (OUT) of the latch 302 wiggling during a scan operation. To prevent wiggling of the latch's output, a link drive circuit controller 640/642/648/652 may be coupled between the link drive circuit 644/646 and ground.

The link drive circuit controller 638/640/642/648/652 receives a scanning signal (SCANNING) which is capable of enabling the link drive circuit 644/646 at an appropriate moment for the purpose of loading data into latch 302. At all other times, the controller 638/640/642/648/652 disables the link drive circuit 644/646. During normal operation of latch 302, a first NFET 642 receives the SCANNING signal through an inverter 638. Since the SCANNING signal is maintained in a low state during regular operation of latch 302, this first NFET 642 is allowed to conduct. However, due to a second, serial-connected NFET 652 being in a non-conductive state (by means of clock CK having activated NFET 648, which NFET 648, when activated, maintains the gate of NFET 652 at a low state), NFET 642 cannot conduct. When scanning is about to begin, clock CK is brought to a low state, and the SCANNING signal is thereafter asserted so that NFET 642 no longer conducts. However, by virtue of PFET 640 being activated, NFET 652 is now allowed to conduct, but cannot due to serial-connected NFET 642 now being in a non-conductive state.

At the close of scanning, the SCANNING signal is once again brought low. However, at this instant, NFET 652 is conducting, and serial-connected NFET 642 also begins to conduct. As a result, the link drive circuit is now activated, and data stored in the scan chain link 308 can be loaded into latch 302. When clock CK once again begins its periodic cycle, a first assertion of clock CK causes NFET 648 to conduct, which conduction clears the voltage at node NNORM and causes NFET 652 to once again enter a nonconductive state, thus disabling the link drive circuit 644/646 once again.

Note that the link load and link drive circuits 620/622/650, 644/646 need only comprise one output transistor each. However, to avoid the necessity of one transistor having to overdrive either the latch 302 or the scan latch 616/618, each of these circuits is provided with two output transistors 620, 622, 644, 646.

Figure 7:
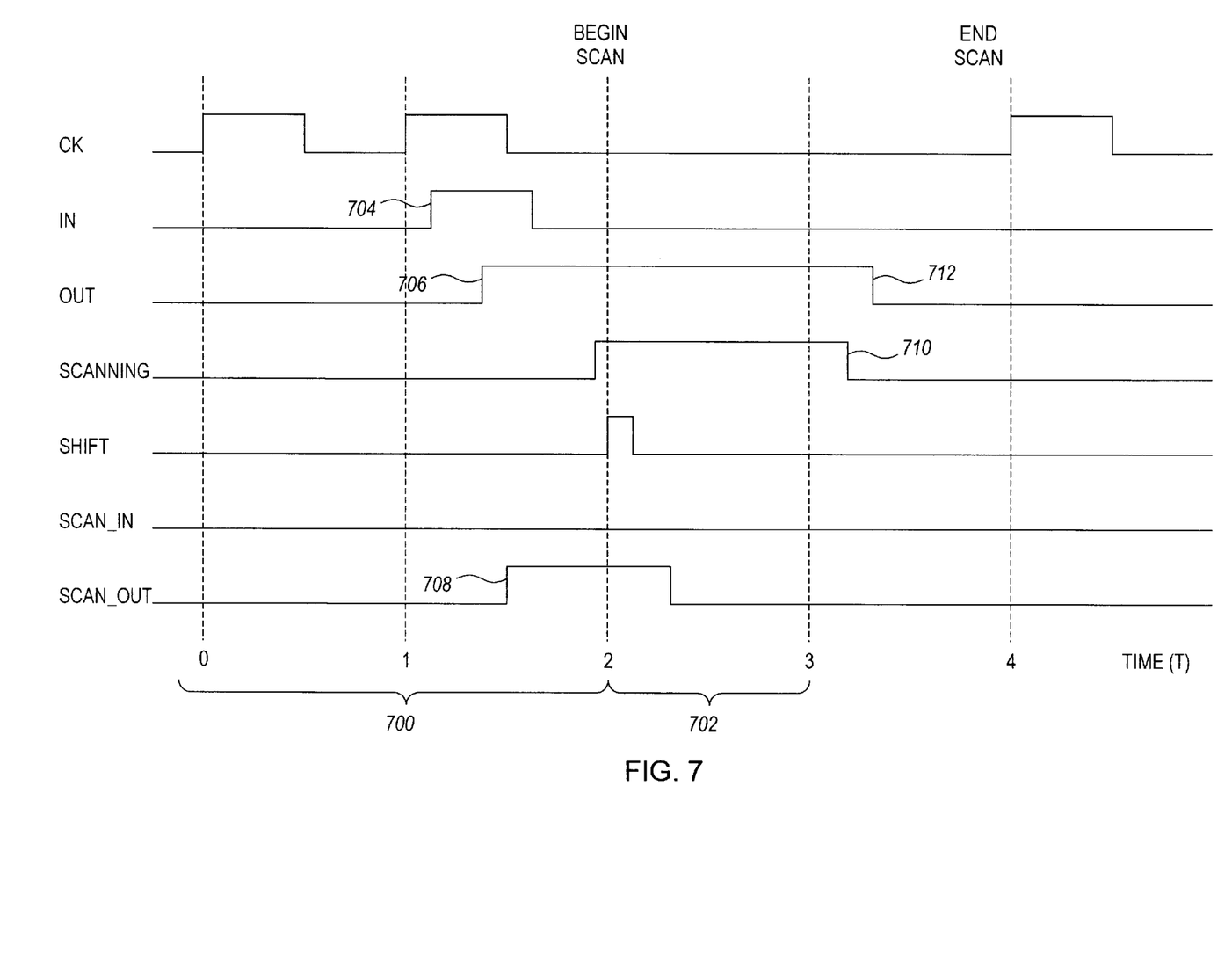
FIG. 7 illustrates timing relationships between various of the signals depicted in FIG. 6.

FIG. 7 illustrates timing relationships between various of the signals depicted in FIG. 6. As in FIG. 5, FIG. 7 is divided into two time frames: one time frame 700 in which the latch 302 is used for its intended purpose, and another time frame 702 in which data is scanned out of and into the latch 302.

When the latch 302 is operating for its intended purpose, clock CK takes the form of a square wave. During each high time of the clock, data appearing at latch input IN is clocked into the latch 302, and shortly thereafter appears at output OUT. For example, shortly after time T=1, input IN rises high 704. Thereafter, output OUT rises high 706. During normal operation of the latch 302, shift signal SHIFT is maintained at a low level, thus closing the second transfer gate 628/630 associated with the latch 302 and allowing data to propagate to SCAN_OUT 708.

When a scan of data out of the latch 302 is begun, the periodic nature of clock CK is discontinued, and shift signal SHIFT takes on the form of a square wave. When SHIFT is asserted, data appearing at SCAN_OUT propagates to a downstream scan chain link 310, and data appearing at SCAN_IN is stepped into the scan latch 616/618. To eliminate the possibility of a race-through condition, in which data races through the first transfer gate 624/626, into the scan latch 616/618, and then through the second transfer gate 628/630 before the second the second transfer gate can be fully opened, the size of the scan latch's FETS may be chosen so as to impart the required delay to a signal's propagation from node SD0 to node SD2. However, the placement of the scan chain link's transfer gates 624/626, 628/630 also helps to prevent a race-through condition.

Although SHIFT is only asserted once in FIG. 7, an actual scan chain operation would most likely result in a plurality of assertions of SHIFT, thereby allowing data to be stepped through a large number of latches. When scanning is complete, the SHIFT signal is deasserted, and the SCANNING signal is also deasserted 710. When the SCANNING signal is deasserted, data stored in the scan latch 616/618 is loaded into the latch 302. Thereafter, clock CK can once again resume its periodic form.

Note that as in the FIG. 4 scan chain link, the high time of the shift signal is preferably short so that the period of conductance for the first transfer gate 624/626 is short, and the period of non-conductance for the second transfer gate 628/630 is short. As a result, current leakage at node NS can be mitigated, since data appearing at node NS is only stored capacitively when the second transfer gate 628/630 is open, and is not held by active feedback devices. The lengths of the FETS 628, 630 in the second transfer gate can also be increased to further mitigate leakage at node NS. If leakage at node NS can be adequately mitigated, there is no need for feedback FETS at node NS.

While illustrative and presently preferred embodiments of the invention have been described in detail herein, it is to be understood that the inventive concepts may be otherwise variously embodied and employed, and that the appended claims are intended to be construed to include such variations, except as limited by the prior art.

What is claimed is:

1. A scan chain which services a plurality of storage elements, said scan chain comprising:
   a) a control line over which a single signal is propagated, said single signal enabling data propagation through the scan chain; and
   b) a plurality of scan chain links, at least some comprising:
      i) a first tri-statable element coupled to said control line, said first tri-statable element comprising an input for receiving a scan output of an upstream storage element which is being serviced by the scan chain, and an output for providing data to a storage element which is being serviced by the scan chain link; and ii) a second tri-statable element coupled to said control line, said second tri-statable element comprising an input for receiving data from the storage element which is being serviced by the scan chain link, and an output which provides a scan output to a downstream storage element which is being serviced by the scan chain.

2. A scan chain as in claim 1, wherein for each of the at least some scan chain links, the output of the first tri-statable element is coupled to a feedback node of the storage element which is being serviced by the scan chain link, and the input of the second tri-statable element is coupled to an output node of the storage element which is being serviced by the scan chain link.

3. A scan chain as in claim 2, wherein for each of the at least some scan chain links, the storage element which is being serviced by the scan chain link comprises an enabled inverter which feeds the feedback node of the storage element, wherein the control line is coupled to the enabled inverter of the storage element, and wherein the single signal propagated over the control line:
   a) disables the enabled inverter of the storage element while;
   b) enabling the first tri-statable element to conduct.

4. A scan chain as in claim 1, further comprising a signal generator for propagating said single signal over the control line, wherein the signal generator propagates said single signal so as to insure that, for each of the at least some scan chain links, the second tri-statable element of the scan chain link has a period of non-conductance which is short enough to prevent the scan output of the second tri-statable element from changing state between periods of conductance of the second tri-statable element.

5. A scan chain as in claim 1, wherein the single signal which is propagated over the control line is a periodic signal having two phases, one phase of which causes the first tri-statable element of each of the at least some scan chain links to conduct, and the second phase of which alternately causes the second tri-statable element of each of the at least some scan chain links to conduct.

6. A scan chain which services a plurality of storage elements, said scan chain comprising:
   a) a control line over which a single signal is propagated, said single signal enabling data propagation through the scan chain; and
   b) a plurality of scan chain links, at least some comprising:
      i) a scan storage element for periodically receiving data stored in a storage element which is being serviced by the scan chain link;
      ii) a first tri-statable element coupled to said control line, said first tri-statable element comprising an input for receiving a scan output of an upstream storage element which is being serviced by the scan chain, and an output for providing data to the scan storage element; and
      iii) a second tri-statable element coupled to said control line, said second tri-statable element comprising an input for receiving data from the scan storage element, and an output which provides a scan output to a downstream storage element which is being serviced by the scan chain.

7. A scan chain as in claim 6, wherein each of the at least some scan chain links further comprises a link load circuit, the link load circuit comprising one or more inputs for receiving data stored in the storage element which is being serviced by the scan chain link, a control input for receiving a signal which loads data into the storage element which is being serviced by the scan chain link, and one or more outputs; the scan storage element being coupled to the one or more outputs of the link load circuit, and the scan storage element periodically receiving, via said link load circuit, data stored in the storage element which is being serviced by the scan chain link.

8. A scan chain as in claim 7, wherein the link load circuit comprises three transistors:
   a) the first and the second transistors being respectively coupled between the first and second nodes of the scan storage element and an intermediate node of the link load circuit;
   b) the gates of the first and second transistors 1) serving as said link load circuit inputs for receiving data stored in the storage element which is being serviced by the scan chain link, and 2) being respectively coupled to first and second nodes of the storage element which is being serviced by the scan chain link; and
   c) the third transistor being coupled between the intermediate node and a power rail, the gate of the third transistor serving as said link load circuit control input.

9. A scan chain as in claim 6, wherein each of the at least some scan chain links further comprises a link drive circuit, the link drive circuit comprising a first input for receiving data from the scan chain link, and an output coupled to the storage element which is being serviced by the scan chain link.

10. A scan chain as in claim 9, wherein the link drive circuit further comprises a control input, and wherein the scan chain link further comprises a link drive circuit controller which is coupled to the control input of the link drive circuit, the link drive circuit controller comprising an input for receiving a scanning signal, which scanning signal enables and disables the link drive circuit.

11. A scan chain as in claim 9, wherein each of the at least some scan chain links further comprises an inverting buffer, the second tri-statable element being coupled to the scan storage element of the scan chain link via said inverting buffer, wherein the link drive circuit comprises a second input for receiving data from the scan chain, and wherein the second node of the scan storage element drives the first input of the link drive circuit, and an output of the inverting buffer drives the second input of the link drive circuit.

12. A scan chain as in claim 6, further comprising a signal generator for propagating said single signal over the control line, wherein the signal generator propagates said single signal so as to insure that, for each of the at least some scan chain links, the second tri-statable element of the scan chain link has a period of non-conductance which is short enough to prevent the scan output of the second tri-statable element from changing state between periods of conductance of the second tri-statable element.

13. A scan chain as in claim 6, wherein the single signal which is propagated over the control line is a periodic signal having two phases, one phase of which causes the first tri-statable element of each of the at least some scan chain links to conduct, and the second phase of which alternately causes the second tri-statable element of each of the at least some scan chain links to conduct.

14. In a scan chain which services a plurality of storage elements, a scan chain link, comprising:
   a) storage means for periodically receiving and storing a copy of data which is held in a storage element N which is being serviced by the scan chain, said storage means receiving said copy of data held in the storage element N in response to assertion of a signal which loads data into the storage element N;

b) a first tri-statable element comprising an input for receiving a scan output of a storage element N−1 which is being serviced by the scan chain, an output coupled to a first node of said storage means, and a number of control inputs;

c) a second tri-statable element comprising an input coupled to a second node of said storage means, an output which provides a scan output for the storage element, and a number of control inputs; and d) means for loading the storage element N with data stored in the storage means.

15. A scan chain as in claim 14, further comprising means for disabling said means for loading the storage element N with data stored in the storage means, said disabling means insuring that data stored in the storage element N remains in the storage element N while data is being stepped through the scan chain.

16. A method of scanning data out of a number of storage elements, comprising, alternately:

a) closing a first tri-statable element while opening a second tri-statable element, the first tri-statable element being coupled to a storage element N, said closing advancing data stored in the storage element N to a scan output node; and b) closing the second tri-statable element while opening the first tri-statable element, the second tri-statable element being coupled to a storage element N+1, said closing storing data appearing on the scan output node in the storage element N+1.

17. A method as in claim 16, further comprising propagating a periodic signal over a control line, wherein a first phase of the periodic signal initiates the closing of the first tri-statable element and the opening of the second tri-statable element, and wherein a second phase of the periodic signal initiates the closing of the second tri-statable element and the opening of the first tri-statable element.

18. A method as in claim 17, further comprising preventing current leakage at the scan output node by insuring that said periodic signal opens the first tri-statable element for relatively short periods of time.

19. A method as in claim 17, wherein the periodic signal causes the second tri-statable element to be closed for shorter of periods of time than the first tri-statable element is closed.

20. A method as in claim 16, further comprising sizing transistors of the storage element N+1 so as to delay propagation of signals from a feedback node of the storage element N+1 to an output of the storage element N+1.

21. A method as in claim 16, further comprising sizing transistors of the first tri-statable element so as to prevent the scan output node from changing state between openings of the first tri-statable element.

22. A method as in claim 16, further comprising, while closing the second tri-statable element and opening the first tri-statable element, disabling an inverting buffer of the storage element N+1, which inverting buffer drives a feedback node of the storage element N+1.

* * * * *